United States Patent
Gindele et al.

(10) Patent No.: US 12,084,374 B2
(45) Date of Patent: Sep. 10, 2024

(54) METHOD FOR PRODUCING GLASS WAFERS FOR PACKAGING ELECTRONIC DEVICES, AND ELECTRONIC COMPONENT PRODUCED ACCORDING TO THE METHOD

(71) Applicant: SCHOTT AG, Mainz (DE)

(72) Inventors: Frank Gindele, Schweitenkirchen (DE); Christian Rakobrandt, Schwindegg (DE); Kazuhito Miyawaki, Shiga (JP); Robert Hettler, Kumhausen (DE); Takahisa Uchida, Kanagawa (JP)

(73) Assignee: SCHOTT AG, Mainz (DE)

( * ) Notice: Subject to any disclaimer, the term of this patent is extended or adjusted under 35 U.S.C. 154(b) by 629 days.

(21) Appl. No.: 17/161,278

(22) Filed: Jan. 28, 2021

(65) Prior Publication Data
US 2021/0230041 A1   Jul. 29, 2021

(30) Foreign Application Priority Data
Jan. 28, 2020 (DE) ............... 10 2020 101 982.3

(51) Int. Cl.
*C03B 23/02* (2006.01)
*C03B 23/203* (2006.01)
(Continued)

(52) U.S. Cl.
CPC ............ *C03B 23/203* (2013.01); *C03B 23/02* (2013.01); *C25D 3/12* (2013.01); *H01L 33/0095* (2013.01);
(Continued)

(58) Field of Classification Search
CPC .............. C03B 23/03; C03B 2215/414; C03B 2215/46–50; B29C 43/021;
(Continued)

(56) References Cited

U.S. PATENT DOCUMENTS 4,891,053 A * 1/1990 Bartman ............... C03B 11/08
                                                264/1.21
5,994,248 A * 11/1999 Gandarillas-Lastra ...........
                                                C03C 3/078
                                                65/83
(Continued)

FOREIGN PATENT DOCUMENTS

JP    2000313627 A *  11/2000  ............. C03B 11/08
JP    2002020130 A *   1/2002  ............. C03B 11/08
(Continued)

OTHER PUBLICATIONS

JP 2012-148907 A (Funatsu) Aug. 9, 2012 (English language machine translation). [online] [retrieved Sep. 15, 2023]. Retrieved from: Espacenet. (Year: 2012).*

*Primary Examiner* — Erin Snelting
(74) *Attorney, Agent, or Firm* — Ruggiero McAllister & McMahon LLC

(57) ABSTRACT

A method is provided for producing a patterned glass wafer for packaging electronic devices in a wafer assembly. The method includes placing a glass sheet between two mold halves and heating until the glass sheet softens, while the mold halves are pressed against one another so that the glass sheet is reshaped and forms a patterned glass wafer. The first mold half has an array of projections and the second mold half has an array of recesses. The mold halves are arranged and shaped so that the recesses and projections oppose each other. The projections introduce cavities into the glass sheet during the reshaping and with the glass flowing into the recesses of the second mold half during the reshaping. The recesses are deep enough for the glass to at least partially not come in contact therewith and to form a convexly shaped glass surface in each recess.

23 Claims, 6 Drawing Sheets

(51) Int. Cl.
*C25D 3/12* (2006.01)
*H01L 33/00* (2010.01)
*H01L 33/56* (2010.01)

(52) U.S. Cl.
CPC .......... *H01L 33/56* (2013.01); *C03B 2215/41* (2013.01); *C03B 2215/46* (2013.01)

(58) Field of Classification Search
CPC ..... B29C 43/36–361; B29C 2014/3602–3626; B29C 2043/3634; B29C 33/0022; B29C 33/42; C03C 3/089
See application file for complete search history.

(56) References Cited

U.S. PATENT DOCUMENTS

| | | | |
|---|---|---|---|
| 10,347,806 B2 | 7/2019 | Liu | |
| 2006/0096321 A1* | 5/2006 | Quenzer | C03B 11/082 65/102 |
| 2010/0055395 A1* | 3/2010 | Ukrainczyk | C03C 3/085 65/106 |
| 2016/0285232 A1 | 9/2016 | Reinert | |
| 2017/0029311 A1* | 2/2017 | Brockmeier | C03B 11/084 |
| 2020/0299170 A1* | 9/2020 | Jenkins | B29D 11/005 |

FOREIGN PATENT DOCUMENTS

| | | | |
|---|---|---|---|
| JP | 2012148907 A | * | 8/2012 |
| WO | 2015082477 | | 6/2015 |

* cited by examiner

METHOD FOR PRODUCING GLASS WAFERS FOR PACKAGING ELECTRONIC DEVICES, AND ELECTRONIC COMPONENT PRODUCED ACCORDING TO THE METHOD

CROSS REFERENCE TO RELATED APPLICATIONS

This application claims the benefit under 35 USC § 119 of German Application 10 2020 101 982.3 filed Jan. 28, 2020, the entire contents of which are incorporated herein by reference.

BACKGROUND

1. Field of the Invention

The invention generally relates to the manufacturing of encapsulated electronic components, in particular encapsulated optoelectronic components. More particularly, the invention provides a wafer-based manufacturing concept for hermetic packages for optoelectronic devices.

2. Description of Related Art

The processing of optoelectronic components including their encapsulation is known per se from the prior art. For an efficient manufacturing process of the components, fabrication in a wafer is preferred as an alternative to an individual fabrication process for each package. In this way, the packaging and bonding steps can be performed in parallel and made cost-effective.

U.S. Pat. No. 10,347,806 B2 discloses a method in which UV LED devices are disposed in a patterned substrate with cup-shaped recesses. The substrate is bonded to a fused silica glass wafer having integrated lenses, by anodic bonding. The UV-LED modules are thus encapsulated in the cavities defined by the cup-shaped recess with the fused silica glass wafer placed thereon. The encapsulated UV LEDs can then be separated. However, with this method, the LED devices have to be introduced into the small cup-shaped recesses and soldered therein.

WO 2015/082477 A1 discloses a method for producing a housed radiation-emitting component on the wafer level. According to this method, a mold substrate is used to obtain a patterned cap substrate made of glass. For this purpose, a cap substrate and the mold substrate are heat treated so as to cause the glass material of the cap substrate to be deformed, molded or to flow into the recesses between island regions of the mold substrate. The cap substrate is then removed to obtain the patterned cap substrate. Accordingly, the mold substrate is used for molding cap substrates by glass flow processes. In this way, window components can be integrated into a cap substrate which can then be used to hermetically seal sensitive radiation sources. Removal is achieved by mechanical separation, selective etching or etching away of the semiconductor material of the mold substrate. In both processes, the mold substrate is lost, so it has to be produced again for each cap substrate.

SUMMARY

The invention is therefore based on the object of simplifying the fabrication of optoelectronic components on the wafer level. For this purpose, a method is provided for producing a patterned glass wafer, in which a glass sheet is placed between two mold halves of a mold and heated until the glass sheet softens, while the mold halves are pressed against each other, wherein depending on the type and design of the glass sheet and the mold halves, the acting weight forces may be sufficient for this purpose, so that the glass sheet is molded or reshaped and forms a patterned glass wafer, wherein a first mold half has at least one projection, preferably an array of projections, and a second mold half has at least one recess, preferably an array of recesses, wherein the mold halves of the mold for reshaping the glass sheet are arranged and shaped in such a way that the recesses and projections oppose each other, and wherein the projections introduce cavities into the glass sheet during the reshaping, and wherein the glass of the glass sheet opposite the cavities flows into the recesses of the second mold half during the reshaping, wherein the recesses are deep enough for the glass to at least partially not make contact therewith and so as to form a convexly shaped glass surface in each respective recess. The reshaping is in particular achieved by pressing the mold halves together. The pressing pressure can also be exerted solely by the weight of the mold half lying on top and the glass sheet. Since the glass remains out of contact with the mold halves, the convex glass surface is freely shaped. The surface profile is thus mainly determined by the surface tension of the involved materials and the environmental conditions. The wafer produced in this way can in particular be used for packaging electronic devices in a wafer assembly. The cavities stamped into the wafer can accommodate the electronic devices, in particular optoelectronic devices disposed on the corresponding substrate wafer, even if the devices protrude or form projections.

The present disclosure also relates to the production of the electronic components, preferably optoelectronic components encapsulated by the patterned glass wafer. For this purpose, a method is provided for producing encapsulated electronic components, in particular optoelectronic components, in which a substrate wafer is equipped with a multitude of electronic devices. The substrate wafer equipped with the electronic devices is bonded to the side of the patterned glass wafer which has the cavities, so that the electronic devices are hermetically enclosed in the cavities. The wafer assembly produced in this way is separated, for example by sawing, by laser, or scribe-and-break processes, so that individual electronic components are obtained which comprise a substrate separated from the substrate wafer and including the electronic device, and a glass cover separated from the patterned glass wafer and hermetically sealing the device in a cavity.

DETAILED DESCRIPTION

Figure 1:
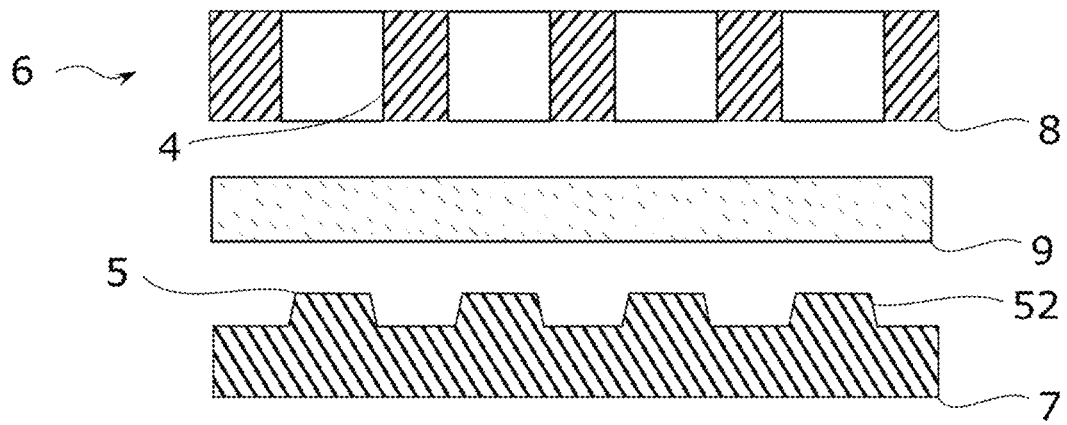
FIGS. 1 to 6 show method steps for producing an encapsulated electronic component, in particular an optoelectronic component.
Figure 2:
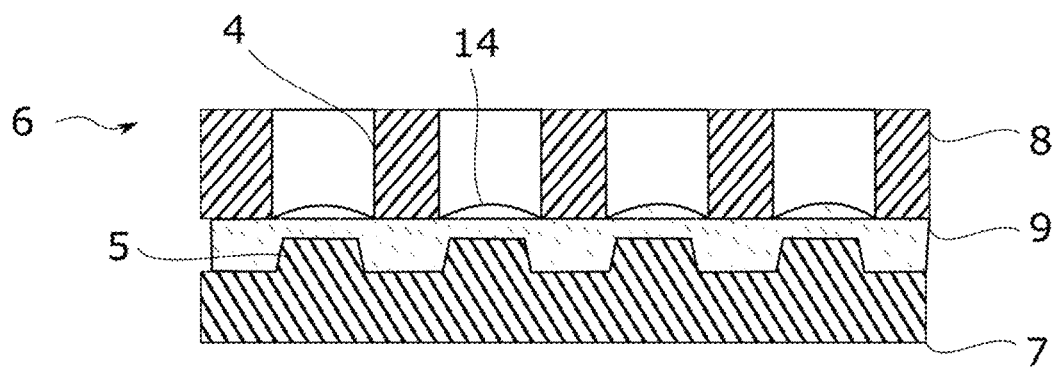
Figure 3:
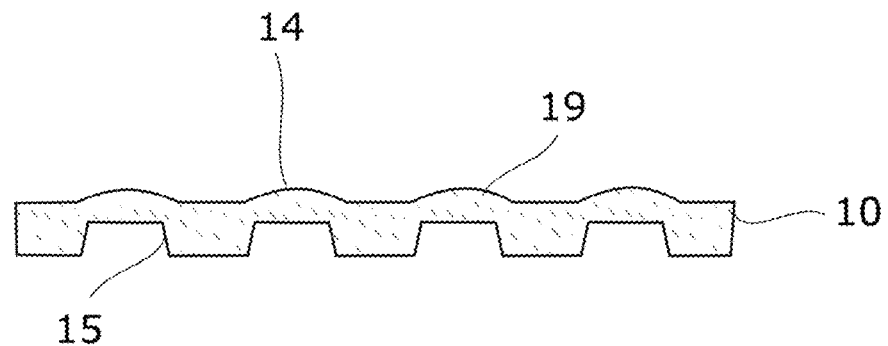
Figure 4:
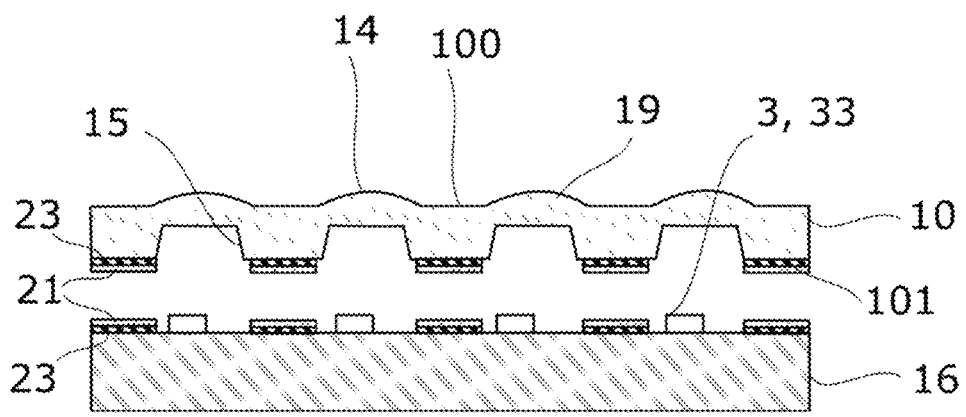
Figure 5:
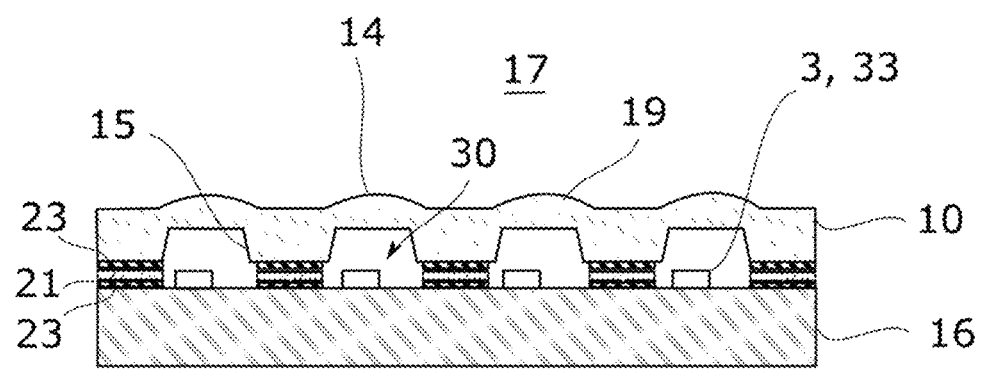
Figure 6:
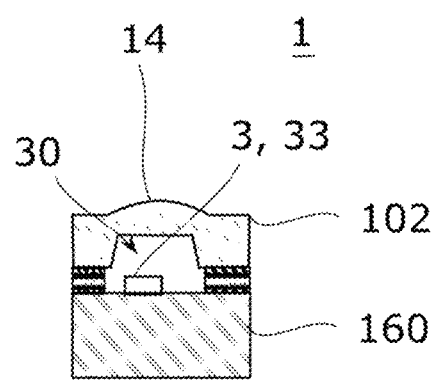

Method steps for producing a patterned glass wafer will be explained with reference to FIGS. 1 to 3. FIGS. 4 to 6 show the further processing using the glass wafer until an encapsulated electronic component is obtained. As illustrated in FIG. 1, the method for producing the patterned glass wafer 10 is based on providing a glass sheet 9 and placing the glass sheet between two mold halves 7, 8 of a mold 6. The mold is intended to bring the glass into the desired shape by pressing. The glass sheet is heated together with the mold halves 7, 8 until the glass sheet 9 softens. The mold halves 7, 8 are pressed against each other so that the softened glass begins to flow under the applied pressure. As illustrated, the first mold half 7 has at least one projection 5, in particular an array of projections 5, and the second mold half 8 has at least one recess 4, preferably an array of recesses 4. As in the example shown, the flanks 52 of the one or more projections 5 may be beveled in order to facilitate the subsequent removal of the shaped glass wafer. The reshaping or molding process of the glass is preferably performed without a release agent, in particular in order to not impair the later optically effective surfaces of the patterned wafer, for example by contamination with release agent residues, haziness or impressed roughness. Mechanical or chemical post-processing or post-treatment can thus advantageously be dispensed with. Accordingly, the surface of the convex glass surfaces 14, 51 preferably corresponds to the initial roughness of the glass sheet or is even improved by the thermomechanical shaping process, so that one can speak of a fire-polished surface.

The recesses 4 may in principle also be through openings, as in the example shown. In contrast to what is illustrated, the walls of the recesses do not have to exclusively run perpendicular to the surface of the glass sheet 9 or to the mold surface of the mold half 8. Rather, the recesses 4 may taper or widen. Optionally, the lens geometry of the so shaped glass wafer can be influenced in this way. The recesses 4 of mold half 8 and the projections 5 of mold half 7 oppose each other. Under the impact of the applied pressure, the glass begins to yield on the projections 5. Thereby, the glass will also flow into the respective opposite recess 4, at least partially. As a result, under the influence of surface tension, the glass forms a convex glass surface 14. The recesses are deep enough so that the glass does not come into contact with the mold half 8 at the apex of the convex glass surface 14. At the same time, the projections 5 of mold half 7 form cavities 15 on the side of the glass sheet 9 opposite the convex glass surfaces 14. FIG. 2 shows the mold with the completely reshaped glass sheet 9. The pressing process caused the glass sheet 9 to be reshaped into a patterned glass wafer 10 which is illustrated in FIG. 3. According to one embodiment not limited to the specific exemplary embodiment, the wafer has a diameter of four to six inches, in particular more than 10 cm. The wafer does not need to be round. In the case of non-round wafers, such as square or, more generally, polygonal wafers, the above dimensions apply to the largest transverse dimension, that is to say the diagonal length in the case of a square wafer. The recesses 4 and also the elevations 5 are not limited to round shapes. Polygonal, rectangular, in particular square or non-round shapes are conceivable as well. Also, the recesses 4 and the elevations 5 may have different shapes, depending on the desired pattern of the glass sheet, these patterns may also be mixed on one wafer.

The convex glass surfaces 14 define lenses 19 on side 100 of the patterned glass wafer 10, which are useful for focusing light that is emitted from the cavity or transmitted into the cavity 15. The so obtained patterned glass wafer can now be used to encapsulate electronic devices on the wafer level. For this purpose, a substrate wafer 16 is equipped with a multiplicity of electronic devices 3, or a so equipped substrate wafer 16 is provided. This wafer is now intended to be bonded to the side 101 of the patterned glass wafer 10 which has the cavities 15. FIG. 4 shows the glass wafer 10 with the substrate wafer 16 to be bonded. Materials that can be considered for the substrate wafer 16 include silicon or other semiconductors as well as ceramics. Ceramic materials for the wafer can in particular be oxides, such as $Al_2O_3$, or else nitrides. Nitride ceramic wafers are particularly preferred, here in particular aluminum nitride wafers or at least ceramic wafers containing aluminum nitride.

Materials that are suitable for the mold halves or at least for their glass contact surfaces include carbon or graphite, Invar, Kovar, chromium-nickel steel, and precious metals. It is also possible for the glass contact surfaces to be coated. Suitable coatings include boron nitride or graphite, for example, in order to make it easier to mold the glass. More generally, the glass contact surfaces of the mold halves are preferably designed so as to achieve a desired surface finish in the optically effective areas.

According to a preferred embodiment, the electronic devices are light-emitting diodes 33. In particular blue or ultraviolet light emitting light-emitting diodes (UV LEDs) are considered.

According to a preferred embodiment, the substrate wafer 16 is bonded or soldered to the patterned glass wafer 10 using a solder 21. The solder may be a glass solder or a metal solder. Gold-tin solder is particularly suitable as the metal solder. According to yet another embodiment, it is suggested, for facilitating the soldering in order to establish a hermetic bond, that at least one of the two wafers 10, 16 is provided with a patterned metal coating 23 as an adhesion layer for the solder 21. In the illustrated example, both the substrate wafer 16 and the patterned glass wafer 10 are coated with a metal coating 23. Metals that adhere well to glass and also to a ceramic material of the substrate wafer 16 include tungsten and chromium, inter alia. The metal coating 23 may comprise multiple layers. In this way, by combining different metals, good adhesion can be achieved between the metal coating and the respective substrates on the one hand, i.e. the glass wafer 10 and the substrate wafer 16, and good adhesion of the solder 21 on the other hand.

The hermetically sealing bond between wafers 10, 16 can be achieved in the following ways and with the following steps:

The bond may be produced by a soldering process using metal solder. As in the illustrated example, the substrate wafer 16 and/or the cap or glass wafer 10 are already provided with a solderable surface or solder coating on the wafer level. Alternatively or additionally, a solder preform may be placed between the glass wafer 10 and the substrate wafer 16 and soldered under the influence of temperature. As an alternative or in addition to heating the entire stack consisting of the two wafers 10, 16, the metal solder can be heated locally by a laser process. According to a particular embodiment, such a laser process may include soldering using an ultra-short pulsed laser.

The bond may be produced by a soldering process using glass solder. Similar to the metal solder, the glass solder is placed between the two wafers, as a preform. The glass solder is caused to melt by a temperature process or also by local heating using a laser. As in the embodiment with the metal solder, both heating techniques may be combined. Optionally, the substrate wafer or the glass wafer is pre-coated with a low-melting glass, i.e. again a solder coating, and the latter is then caused to melt.

When joining, in particular when directly bonding the wafers through local heating, for example using a laser, it is also conceivable to bond the substrate wafer 16 and the patterned glass wafer 10 to one another without an intermediate solder layer. This can be achieved by melting with or on a patterned metal coating 23 and/or even without such a coating by locally melting the material of one or both wafers 10, 16. Melting by an ultra-short pulsed laser is particularly suitable for this purpose. In the case of such solder-free bonding, i.e. without the involvement of an additional solder, so that the bond is or can be produced in particular by a molten phase of the substrate wafer 16 and/or of the patterned glass wafer 10 itself, direct local fusion of the glass wafer with the substrate wafer is achieved in a ring-shaped or circumferential manner. The term "ring-shaped" is to be understood in general terms and generally refers to a pattern extending around an inner area and which, besides a round shape, may have any arbitrary shape such as a polygonal shape. In this embodiment, with the closed ring-shaped fusion joint, in particular without the use of a solder or an additional layer such as a metal layer, hermetic sealing of the area enclosed by the fusion joint is achieved. In order to obtain such a fusion joint using a laser, the laser can be focused on the adjoining surfaces of the two wafers in order to melt the material of one or both wafers there. Compared to anodic bonding, an advantage of the methods using a solder or an intermediate layer and of the above-described direct local fusion of the wafers is that the surfaces to be bonded do not have to be polished or flat, but may exhibit residual roughness or waviness.

FIG. 5 shows the wafer assembly 17 comprising the substrate wafer 16 and the patterned glass wafer 10 bonded thereto. The two solder layers on the substrate wafer 16 and on the glass wafer 10 have been fused together by soldering and form a tight bond between the substrate wafer 16 and the side 101 of the glass wafer 10 which has the cavities 15. Once the two wafers 10, 16 have been arranged and bonded, the devices 3 to be encapsulated, such as in particular light-emitting diodes 33, are disposed in the hermetically sealed hollow spaces 30 defined by the cavities 15.

In particular in the case of a substrate wafer 16 made of a nitride ceramic and especially with an aluminum nitride wafer, there is the problem of poor adhesion to other materials. Therefore, if an aluminum nitride wafer is used, it is particularly advantageously coated beforehand with a metallization or a metallic layer in the areas to be soldered. This patterned metal coating 23 may be deposited using a vacuum deposition method, in particular sputter deposition or vapor deposition. Such a metallization may also be advantageous for other wafer materials in order to simplify the soldering when using a metallic solder and also with a glass solder. According to one embodiment, in the case of a multilayer metal coating 23, a first layer is deposited using a vacuum deposition technique. A further layer can then also be applied using a vacuum deposition technique. However, it is in particular also possible for such a further layer to be grown on the first layer by electroplating. This allows to obtain greater total layer thicknesses in a simple way. A material well-suited for electroplated layers is nickel, for example. Thus, according to one example, the patterned metal coating 23 may comprise an electroplated layer, for example made of nickel, that is applied on a first layer, for example made of chromium or tungsten or of an alloy containing chromium or tungsten.

According to yet another alternative or additional embodiment, the patterned metal coating 23 is implemented as a multi-layer coating including a final gold layer. For example, the embodiment described above and comprising a tungsten or chromium layer and a nickel layer grown hereon by electroplating can be supplemented by a final gold layer. Gold provides for very good adhesion to a solder 21 in the form of a gold-tin solder. The layer thickness of such a gold layer may be kept very thin and will preferably be less than 1 m, for example 0.1 m. More generally, without being limited to specific examples or embodiments described herein, according to one aspect, a total layer thickness of the patterned metal coating 23 is suggested to be in a range from 0.1 micrometers to 20 micrometers.

Subsequently to the bonding, the wafer assembly 17 can be separated so that individual electronic components 1 are obtained, as illustrated in FIG. 6, which comprise a substrate 160 separated from the substrate wafer 16 and comprising the electronic device 3, and a glass cover 102 separated from the patterned glass wafer 10 and hermetically sealing the device 3 in a cavity 15.

According to a particularly preferred embodiment, a ceramic substrate wafer 16 is used. It is generally preferred for the substrate wafer 16 to have a thermal conductivity of at least 20 W/(m·K), preferably at least 50 W/(m·K), more preferably at least 75 W/(m·K), most preferably at least 100 W/(m·K). The substrate wafer 16 may in particular be a nitride ceramic wafer. A material particularly preferred for this purpose is an aluminum nitride wafer. Nitride ceramics and in particular aluminum nitride are characterized by high thermal conductivity. Pure aluminum nitride has a thermal conductivity of 180 W/(m·K). In practice, the thermal conductivity of AlN ceramics may be lower. In one embodiment, the thermal conductivity of the substrate wafer is at least 150 W/(m·K), in particular at least 170 W/(m·K), regardless of the material it is made of.

The use of a highly thermally conductive substrate for the device 3 is particularly advantageous if the device 3 is to be cooled or if it produces a lot of heat during operation. This is in particular the case when the substrate wafer 16 is equipped with blue and especially with UV light emitting light-emitting diodes, and for corresponding encapsulated light-emitting diodes as the optoelectronic components produced in this way.

Optoelectronic packages which have an optically transparent window as according to the present disclosure, especially in the UV A/B and C ranges, can per se be well implemented using a material combination of ceramics and fused silica glass. Fused silica glass is characterized by high UV transparency. The ceramic, such as $Al_2O_3$ or AlN, can be used as the substrate or submount material, and the fused silica glass as an optically transparent window or lens. Besides fused silica glass, silicate glasses may generally also come into consideration. Both components, the substrate material and the optical window, have to be joined to one another by a bonding process. For a hermetically sealing bond, a soldering process with metal solder is primarily considered. Fused silica glass has a coefficient of linear thermal expansion (CTE) of $5.5 \cdot 10^{-7} K^{-1}$. The expansion coefficient of aluminum nitride is about $4.5 \cdot 10^{-6} K^{-1}$, which is greater by almost an order of magnitude. $Al_2O_3$ even has a coefficient of linear thermal expansion of around $8 \cdot 10^{-6} K^{-1}$. In the event of a thermal load on the entire package during operation or during fabrication, this will cause thermomechanical stresses and possibly a break of the package or of the bond between the components. This problem becomes particularly significant for fabrication in a wafer assembly. As mentioned above, the patterned glass wafer 10 preferably has a diameter of more than 10 cm, for example a diameter in the range from 4 to 6 inches. Correspondingly, the wafer assembly 17 then preferably has the same dimensions.

In typical manufacturing processes which involve more than 120° C., also more than 200° C., or even more than 260° C., thermal expansion will already be high enough for this size to cause cracks and defects across the wafer and to endanger a hermetic bond.

This can furthermore also occur in the case of the individual package module or the packaged electronic or optoelectronic component 1 during later operation. Especially when the package is operated at ambient temperatures above 50° C. or above 80° C., the mismatch in the coefficients of linear thermal expansion can lead to a break in the hermetic bond. It is therefore desirable to have a package that comprises a substrate made of highly thermally conductive ceramic that is both hermetically tight and/or autoclavable and can be mounted or assembled on wafer level. Also, a package is sought that can be operated at high temperatures. According to one aspect of the present disclosure, a material combination and an appropriate bonding technology is provided for this purpose, with materials that are the best possibly matched in terms of their coefficients of linear thermal expansion and with one component being optically transparent, especially in the UV A/B and C ranges. The problem of thermal mismatch between fused silica glass and ceramics, in particular nitride ceramics or $Al_2O_3$, can be solved with a borosilicate glass that has a high boric acid content. More generally, it is contemplated for this purpose according to one embodiment of the invention that the coefficients of linear thermal expansion of the substrate wafer 16 or substrate 160 and of the glass wafer 10 or glass cover 102 differ by less than an absolute value of $5 \cdot 10^{-7} K^{-1}$. In order to furthermore achieve high UV transmittance at the same time, a high silicon oxide content is also advantageous. More generally, one embodiment of the invention contemplates that the patterned glass wafer 10 is made from a borosilicate glass which has a total content of $B_2O_3$ and $SiO_2$ combined of at least 79 percent by weight, preferably at least 83 percent by weight. For high UV transmittance it is moreover favorable if the content of $SiO_2$ in percent by weight is higher than the content of $B_2O_3$ in percent by weight by a factor in the range from 2.5 to 5, preferably in the range from 2.8 to 4.5. According to one exemplary embodiment, a glass can be obtained in this way, which has a coefficient of linear thermal expansion of $4.1 \cdot 10^{-4} K^{-1}$.

Therefore, according to one particular embodiment, without being limited to specific exemplary embodiments, an encapsulated electronic and in particular optoelectronic component 1 is provided, which comprises a substrate 160 made of a nitride ceramic, preferably an aluminum nitride ceramic; an electronic device placed thereon, preferably a UV LED 33; a glass cover 102 soldered to the substrate 160, which has a cavity 15 so as to define a hollow space 30 in which the device 3 is disposed, and wherein the glass cover 102 has an outward facing convex glass surface 14 which defines a lens 19, wherein the convex glass surface is a freely, i.e. contact-free shaped surface, and with at least one of the following features implemented: the coefficients of linear thermal expansion of the glass cover 102 and of the substrate 160 differ by less than an absolute value of $5 \cdot 10^{-7} K^{-1}$; the glass of the glass cover 102 is a borosilicate glass which has a total content of $B_2O_3$ and $SiO_2$ of at least 79 percent by weight, preferably at least 83 percent by weight; the content of $SiO_2$ in percent by weight is greater than the content of $B_2O_3$ in percent by weight by a factor in the range from 2.5 to 5, preferably in the range from 2.8 to 4.5. Since the glass surface is shaped in a contact-free manner, it accordingly has a fire-polished surface.

However, depending on the material of the substrate 160, another silicate glass or, in particular for low-expansion substrate materials, fused silica glass can be used instead of borosilicate glass.

Figure 7:
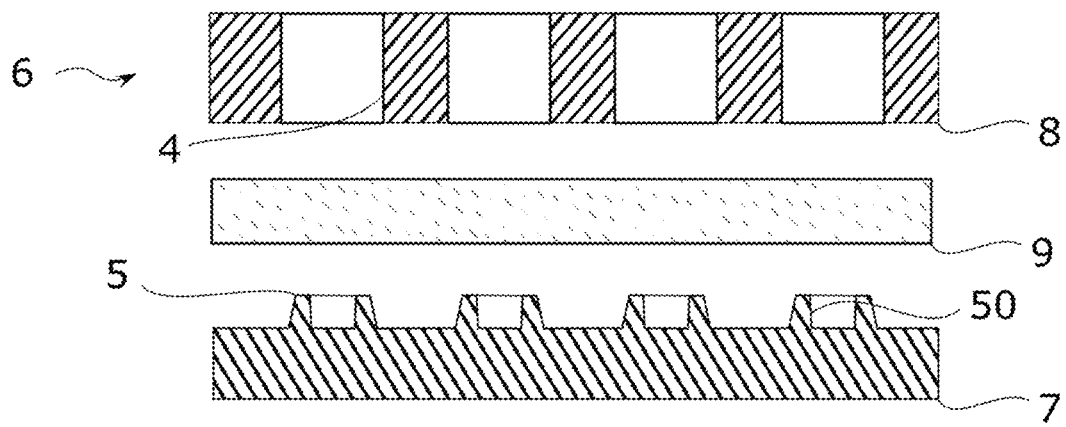
FIGS. 7 to 9 show method steps according to a variant of the method, for producing biconvex lenses.
Figure 8:
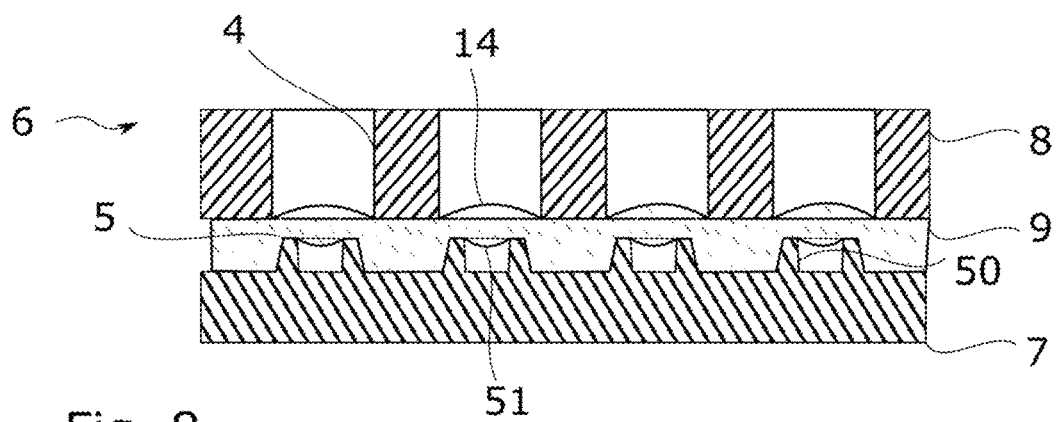
Figure 9:
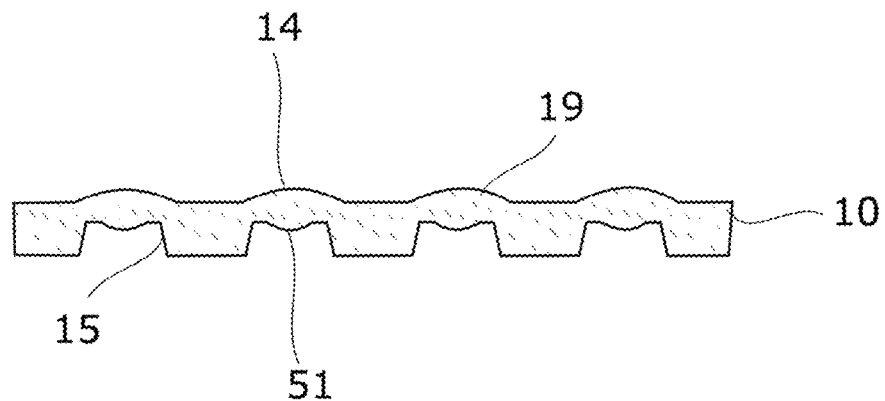

FIGS. 7 to 9 show a variant of the method, which allows to produce a patterned glass wafer with biconvex lenses. The method is in principle based on the fact that the projections 5 in the first mold half 7 have central recesses 50, so that the projections have an annular shape. During the reshaping, in particular during pressing, glass flowing into the recesses 50 again does not make contact, at least partially, and forms convex glass surfaces 51 in the recesses, which in combination with the convex glass surfaces 14 in the recesses 4 of the second mold half 8 define biconvex lenses. In contrast to what is illustrated, the walls of the recesses 50 do not have to run exclusively perpendicular to the surface of the glass sheet 9 or to the mold surface of mold half 7. Rather, the recesses 4 may taper or widen.

FIG. 7 shows the mold 6 with the two mold halves 7, 8 according to this embodiment as well as the glass sheet 9 arranged therebetween. FIG. 8 shows the mold halves 7, 8 after completion of the pressing process with the patterned glass wafer as produced from glass sheet 9 by the pressing. As a result of the glass flowing in, convex glass surfaces 14 and 51 formed in the recesses 4 and 50, respectively, of mold halves 7, 8. FIG. 9 shows the patterned glass wafer 10 after the mold halves 7, 8 have been removed. As in the previously described exemplary embodiment, the projections 5 introduced cavities 15 into the glass wafer 10. In this embodiment, however, convex glass surfaces 51 protrude into the cavities 15. However, the apex of the glass surfaces 51 is preferably sufficiently spaced apart from the surface of the cavities in order to allow for an electronic device 3 to be accommodated. The two convex glass surfaces 14, 51 together define biconvex lenses 19 which have an appropriately high refractive power for focusing emitted light or light incident into the cavity 15.

Figure 10:
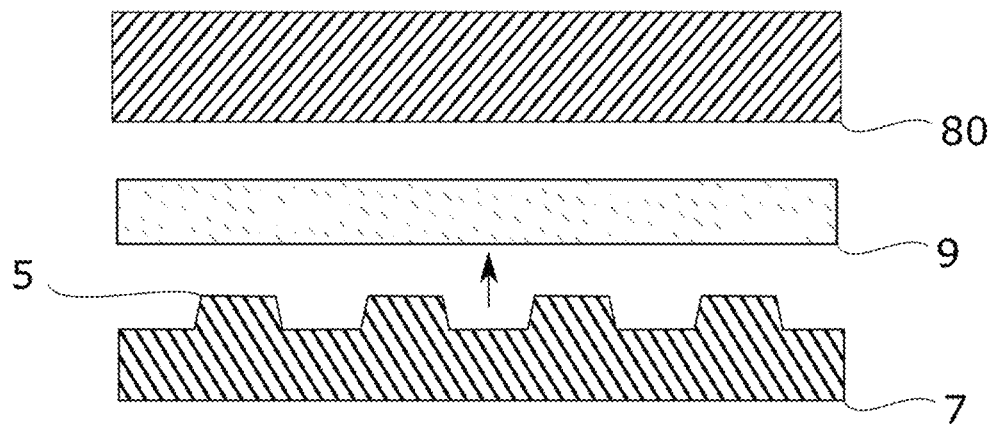
FIGS. 10 and 11 show method steps according to a modification of the variant according to FIGS. 7 through 9.
Figure 11:
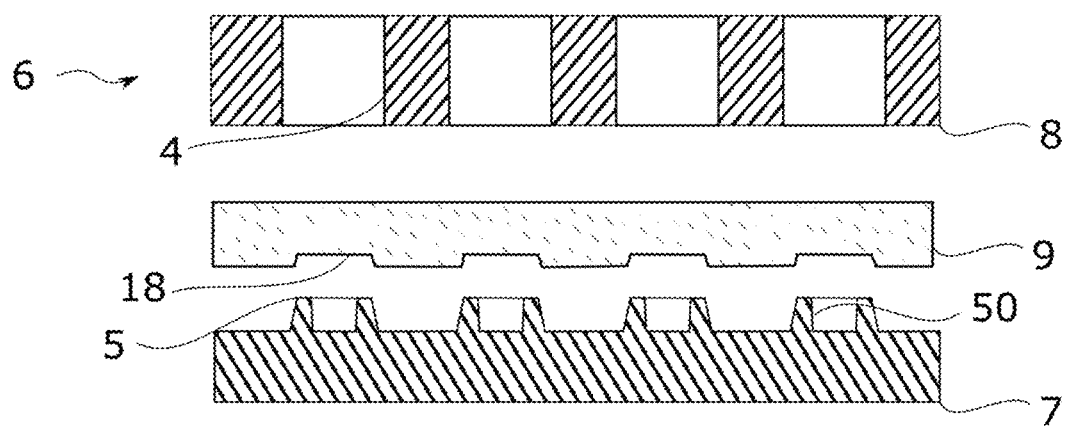

FIGS. 10 and 11 show a modification of the method according to FIGS. 7 to 9. Generally, without being limited to the embodiment of FIGS. 7 to 9, the modification of the method consists in shaping the patterned glass wafer 10 by a multi-step molding process. The glass sheet 9 is subjected to a pre-stamping process prior to the final shaping of the convex glass surfaces 14 and cavities 15. For example, the pre-stamping takes place in a mold 6 with mold halves that are different from the mold halves 7, 8 intended for the final molding process. FIG. 10 shows a mold for this purpose, comprising mold halves 7 and 80. As in the example of FIG. 1, mold half 7 has projections 5. However, the other mold half 80 is flat. This mold can be used to produce pre-stamped features 18 in the form of cavities in the glass sheet 9. However, these cavities will preferably not be as deep as the cavities 15 which are formed into the patterned glass wafer 10 in the subsequent molding process. FIG. 11 shows the glass sheet 9 as pre-stamped using the mold according to FIG. 10 and arranged in the mold 6 which is used to produce biconvex lenses 19 in the glass wafer 10, as in the example of FIG. 7.

Figure 12:
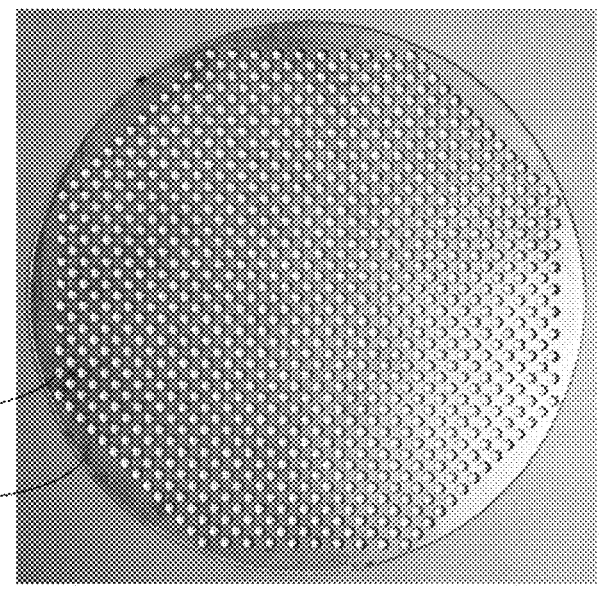
FIG. 12 shows a photograph of a patterned glass wafer.

FIG. 12 shows a photograph of a patterned glass wafer 10. As can be seen from the photograph, the glass wafer 10 may be designed for the parallel fabrication of a large number of optoelectronic components on the wafer assembly. The illustrated example comprises more than 850 convex glass surfaces 14 or lenses 19.

Figure 13:
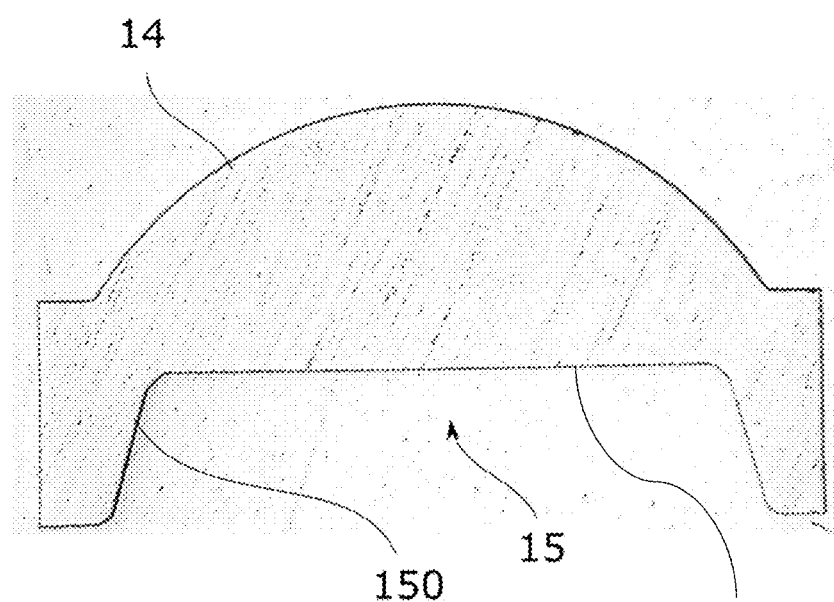
FIG. 13 shows a sectional view of a glass cover.

FIG. 13 shows a sectional view of a glass cover 102 which has been separated from a patterned glass wafer 10 by sawing. Surprisingly, the convex glass surface 14 is almost perfectly spherical, although the surface has been freely shaped in the recess of mold half 8, that is to say without a contacting mold surface.

The side wall 150 of the cavity extends obliquely, corresponding to the obliquely shaped flanks 52 of the projections 5 of mold half 7. Cavity 15 is closed off by a light transmitting surface 151 opposite the convex glass surface 14. This light transmitting surface 151 may be designed to be flat, as in the illustrated example. The glass cover thus has the optical effect of a plano-convex lens.

Surfaces 150 and 151 may exhibit some waviness and/or roughness and/or traces of an etching process as caused by the molding tool. Such features will typically be absent on the convex glass surface 14 which is freely formed, i.e. without a mold.

Figure 14:
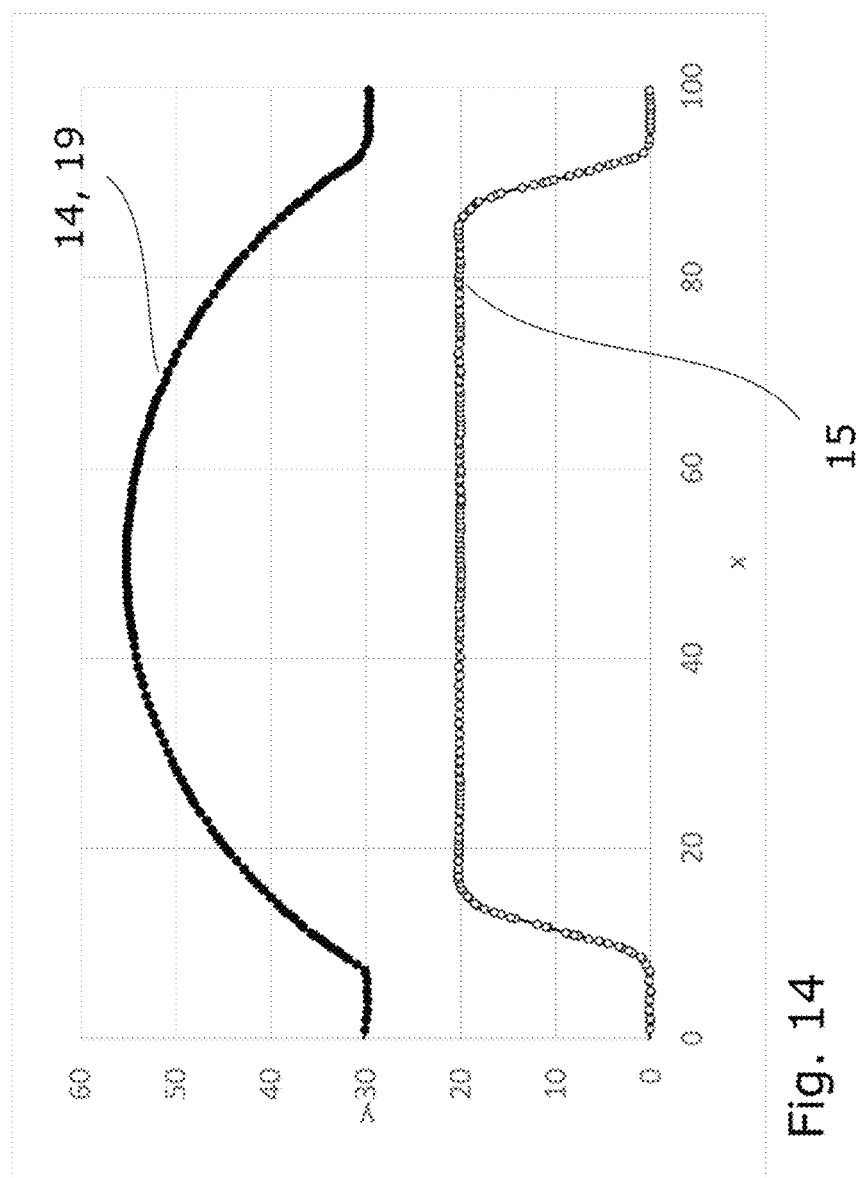
FIG. 14 is a graph of the contour profiles of the cavity and the convex glass surface of the glass cover shown in FIG. 13.

The sectional view can be used to calculate the volumes of cavity 15 and lens 19 from the contours visible therein. According to one embodiment, the volume of the lens 19 is less than or equal to the volume of the opposite cavity 15. If the glass can only yield into the opposite recess of mold half 8 when the projection 5 of mold half 7 is pressed into it, the presently described method will cause the volumes to be very similar or even identical. Therefore, according to a further alternative or additional embodiment, the volumes of lens and cavity differ by less than 10%, preferably by less than 5%. FIG. 14 shows the contour profiles of the two sides of glass element 102, with the convex lens surface 14 defining the lens 19, and with the cavity. If the volumes are calculated from the two curves by integration, with an offset of 30 subtracted from the curve of lens surface 14 in order to obtain the same base line for both curves, a resulting ratio of the lens volume, V(lens), to the cavity volume, V(cavity), is V(lens)/V(cavity)=0.96. The volumes therefore differ by less than 5%, with the volume of the cavity being slightly larger than the volume of the lens.

LIST OF REFERENCE NUMERALS

1 Optoelectronic component
3 Electronic device
4 Recess
5 Projection on 7
6 Mold
7, 8 Mold half
9 Glass sheet
10 Patterned glass wafer
14, 51 Convex glass surface
15 Cavity in 10
16 Substrate wafer
17 Wafer assembly
18 Pre-stamped feature
19 Lens
21 Solder
23 Metallization
30 Hollow space
33 LED
50 Recesses in 5
52 Flank of 5
80 Flat mold half
100, 101 Sides of 10
102 Glass cover
150 Side wall of 15
151 Light transmitting surface of 15
160 Substrate for device 3

What is claimed is:

1. A method for producing a patterned glass wafer for packaging electronic devices in a wafer assembly, comprising:
   placing a glass sheet between a first mold half and a second mold half, wherein the first mold half has an array of projections and the second mold half has an array of recesses, and wherein the first and second mold halves are configured so that the recesses and projections oppose each other; and
   heating until the glass sheet softens while the first and second mold halves are pressed against one another so that the glass sheet is reshaped and forms the patterned glass wafer with the projections introducing cavities into the glass sheet, wherein the glass of the glass sheet opposite the cavities flows into the recesses, wherein the recesses are deep enough for the glass to at least partially not make contact therewith and so as to form a convexly shaped glass surface in each of the recesses, and wherein each projection of the array of projections has a central recess so that each projection of the array of projections has an annular shape so as to form a biconvex lens at each central recess.

2. The method of claim 1, further comprising stamping the glass sheet with pre-stamped features prior to placing the glass sheet between the first and second mold halves.

3. The method of claim 1, wherein the patterned glass wafer comprises a fused silica glass or silicate glass.

4. The method of claim 1, wherein the patterned glass wafer comprises a borosilicate glass having a total content of $B_2O_3$ and $SiO_2$ that is at least 79 percent by weight and/or a content of $SiO_2$ in percent by weight that is greater than a content of $B_2O_3$ in percent by weight by a factor in a range from 2.5 to 5.

5. The method of claim 1, wherein the convexly shaped glass surface in each of the recesses are fire-polished surfaces.

6. The method of claim 1, wherein the patterned glass wafer comprises a borosilicate glass having a total content of $B_2O_3$ and $SiO_2$ of at least 83 percent by weight.

7. The method of claim 1, wherein the patterned glass wafer comprises a glass having a content of $SiO_2$ in percent by weight that is greater than a content of $B_2O_3$ in percent by weight by a factor in a range from 2.8 to 4.5.

8. The method of claim 1, further comprising:
   equipping a substrate wafer with a plurality of electronic devices; and
   bonding the substrate wafer to the patterned glass wafer so as to hermetically seal a respective one electronic device in a respective one of the convexly shaped glass surfaces in each of the recesses to define a wafer assembly.

9. The method of claim 8, wherein the substrate wafer comprises a nitride ceramic wafer or an aluminum nitride wafer.

10. The method of claim 8, wherein the substrate wafer has a thermal conductivity of at least 20 W/(m·K).

11. The method of claim 8, further comprising separating the wafer assembly to obtain individual electronic components.

12. The method of claim 8, wherein the plurality of electronic devices comprise ultraviolet emitting light-emitting diodes.

13. The method of claim 8, wherein the step of bonding the substrate wafer to the patterned glass wafer comprises soldering with a solder selected from a group consisting of a glass solder, a metal solder, and a gold-tin solder.

14. The method of claim 8, wherein the step of bonding the substrate wafer to the patterned glass wafer comprises locally annular fusing the substrate wafer to the patterned glass wafer.

15. The method of claim 8, further comprising providing the substrate wafer and/or the patterned glass wafer with a patterned metal coating, wherein the step of bonding the substrate wafer to the patterned glass wafer comprises soldering using the patterned metal coating.

16. The method of claim 15, wherein the patterned metal coating has a total layer thickness in a range from 0.1 micrometers to 20 micrometers.

17. The method of claim 15, wherein the patterned metal coating comprises a multi-layer patterned metal coating.

18. The method of claim 15, wherein the patterned metal coating comprises a lower layer made of a material selected from a group consisting of tungsten, chromium, and any alloys thereof and/or a final layer made of gold.

19. The method of claim 15, wherein the step of providing the substrate wafer and/or the patterned glass wafer with the patterned metal coating comprises electroplating a layer on the substrate wafer and/or the patterned glass wafer.

20. The method of claim 19, wherein the layer comprises nickel.

21. The method of claim 15, wherein the step of providing the substrate wafer and/or the patterned glass wafer with the patterned metal coating comprises placing a solder preform between the substrate wafer and the patterned glass wafer.

22. The method of claim 15, wherein the step of providing the substrate wafer and/or the patterned glass wafer with the patterned metal coating comprises vapor depositing or sputter depositing the patterned metal coating.

23. The method of claim 8, wherein the biconvex lenses have a feature selected from a group consisting of: a volume of a respective one of the biconvex lenses that is less than or equal to a volume of a respective one of the cavities in the glass sheet, a volume of a respective one of the biconvex lenses and a volume of a respective one of the cavities differ by less than 10%, a volume of a respective one of the biconvex lenses and a volume of a respective one of the cavities differ by less than 5%, and a coefficient of linear thermal expansion of the patterned glass wafer and that of the substrate wafer differ by less than an absolute value of $5 \cdot 10^{-7}$ $K^{-1}$.

* * * * *